United States Patent [19]

Imai et al.

[11] Patent Number: 5,064,747
[45] Date of Patent: Nov. 12, 1991

[54] SENSITIZERS FOR PHOTOCROSSLINKABLE POLYMERS

[75] Inventors: Masanori Imai; Noriaki Watanabe; Kouichi Kawamura, all of Shizuoka, Japan

[73] Assignee: Fuji Photo Film Co., Ltd., Kanagawa, Japan

[21] Appl. No.: 544,469

[22] Filed: Jul. 19, 1990

[30] Foreign Application Priority Data

Jul. 24, 1989 [JP] Japan .................................. 1-190963

[51] Int. Cl.$^5$ ..................... G03F 7/031; G03F 7/038; G03F 7/09
[52] U.S. Cl. .................................. 430/278; 430/287; 430/285; 430/283; 430/286; 430/920; 430/922; 430/915; 430/926; 522/9; 522/16; 522/26; 522/50; 522/53
[58] Field of Search ............... 430/287, 920, 922, 915, 430/926, 285, 283, 286, 278; 522/9, 16, 26, 50, 53

[56] References Cited

U.S. PATENT DOCUMENTS

| | | |
|---|---|---|
| 2,948,610 | 8/1960 | Merrill et al. ............................ 96/33 |
| 3,173,787 | 3/1965 | Clement et al. ................. 430/287 X |
| 3,528,814 | 9/1970 | Riester et al. .................. 430/286 X |
| 3,870,524 | 3/1975 | Watanabe et al. .................... 430/281 |
| 4,062,686 | 12/1977 | Van Allan et al. ............. 430/287 X |
| 4,063,953 | 12/1977 | Fukutani et al. ..................... 430/287 |
| 4,163,097 | 7/1979 | Baumann et al. ............... 430/285 X |

FOREIGN PATENT DOCUMENTS

| | | |
|---|---|---|
| 539571 | 4/1957 | Canada ................................ 430/287 |
| 01-203403 | 8/1989 | Japan ................................... 430/281 |
| 0717074 | 2/1980 | U.S.S.R. ............................... 430/287 |

OTHER PUBLICATIONS

E. M. Robertson et al, "Photosensitive Polymers. II., Sensitization of Poly(Vinyl Cinnamate)", *Journal of Applied Polymer Science*, vol. II, Issue No. 6, pp. 308–311, (1959).

*Primary Examiner*—Cynthia Hamilton
*Attorney, Agent, or Firm*—Burns, Doane, Swecker & Mathis

[57] ABSTRACT

A light-sensitive composition comprises a photo-crosslinkable polymer having a photo-dimerizable unsaturated bond and a sensitizer represented by the following general formula (I):

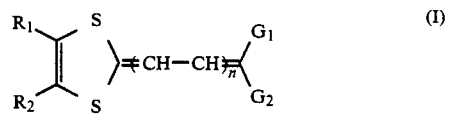

wherein $R_1$ and $R_2$ each independently represents a hydrogen atom, a substituted or unsubstituted alkyl group, a substituted or unsubstituted aryl group, a substituted or unsubstituted heterocyclic group or a substituted or unsubstituted allyl group, provided that $R_1$ and $R_2$ may form a ring together with the carbon atoms to which they are attached; n represents 0, 1 or 2; and $G_1$ and $G_2$ each independently represents a hydrogen atom, a cyano group, a substituted or unsubstituted alkoxycarbonyl group, a substituted or unsubstituted aryloxycarbonyl group, a substituted or unsubstituted acyl group, a substituted or unsubstituted arylcarbonyl group, an alkylthio group, an arylthio group, an alkylsulfonyl group, an arylsulfonyl group or a fluoroalkylsulfonyl group, provided that $G_1$ and $G_2$ do not represent a hydrogen atom simulataneously and that $G_1$ and $G_2$ may form a ring comprising a non-metallic atom and the carbon atoms to which they are attached. According to the present invention, the sensitivity of the light-sensitive composition is greatly improved by the use of the above sensitizer.

19 Claims, No Drawings

SENSITIZERS FOR PHOTOCROSSLINKABLE POLYMERS

BACKGROUND OF THE INVENTION

The present invention relates to a light-sensitive composition which comprises a photo-crosslinkable polymer which can crosslink through a photo-dimerization reaction and a novel sensitizer, and in particular to a light-sensitive composition useful as a light-sensitive layer of a presensitized plate for use in making a lithographic printing plate (hereunder referred to as "PS plate"), as well as a photoresist or the like.

Photo-crosslinkable materials which can crosslink through a photo-dimerization reaction have been well-known and they are used as a principal component of light-sensitive compositions used for preparing PS plates, photoresists or the like. These photo-crosslinkable polymers do not show sufficient light-sensitivity. Therefore, when a PS plate or the like is prepared from such a photo-crosslinkable material, a sensitizer is in general used for enhancing the sensitivity of the resulting light-sensitive composition. Examples of such sensitizers are thioxanthone, benzophenone, Michler's ketone, anthraquinone, anthracene, chrysene, p-dinitrobenzene, 2-nitrofluorenone and merocyanine type dyes. The sensitivity of the composition is improved to some extent by the use of such a sensitizer, but is still insufficient. In addition, naphthothiazoline type dyes as disclosed in U.S. Pat. No. 2,732,301 and 2-(heterocyclyl-carbo nylmethylene)thiazoline-containing merocyanine dyes as disclosed in U.S. Pat. No. 4,062,686 are useful as sensitizers for light-sensitive printing materials, but the sensitivity achieved by these compounds is still insufficient. Thus, there have been a demand for the development of more highly sensitive sensitizers.

SUMMARY OF THE INVENTION

Accordingly, a principal object of the present invention is to provide a light-sensitive composition whose sensitivity is greatly improved.

Other objects of the present invention will be apparent from the following description.

The inventors of this invention have conducted various studies to achieve the foregoing object and have found out that the photo-crosslinking velocity of a photo-crosslinkable polymer-containing photo-crosslinkable light-sensitive composition can be substantially improved by the incorporation of a specific sensitizer into the composition. The present invention has been completed based on this finding.

The present invention relates to a light-sensitive composition which comprises a photo-crosslinkable polymer having a photo-dimerizable unsaturated bond and a sensitizer represented by the following general formula (I):

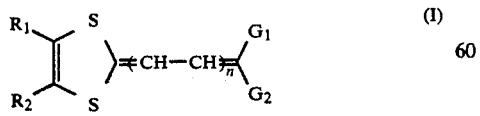

wherein $R_1$ and $R_2$ each independently represents a hydrogen atom, a substituted or unsubstituted alkyl group, a substituted or unsubstituted aryl group, a substituted or unsubstituted heterocyclic group or a substituted or unsubstituted allyl group, provided that $R_1$ and $R_2$ may form a ring together with the carbon atoms to which they are attached;

n represents 0, 1 or 2; and $G_1$ and $G_2$ each independently represents a hydrogen atom, a cyano group, a substituted or unsubstituted alkoxycarbonyl group, a substituted or unsubstituted aryloxycarbonyl group, a substituted or unsubstituted acyl group, a substituted or unsubstituted arylcarbonyl group, an alkylthio group, an arylthio group, an alkylsulfonyl group, an arylsulfonyl group or a fluoroalkylsulfonyl group, provided that $G_1$ and $G_2$ do not represent a hydrogen atom simultaneously and that $G_1$ and $G_2$ may form a ring comprising a non-metallic atom and the carbon atoms to which they are attached.

DETAILED EXPLANATION OF THE INVENTION

The present invention will hereinafter be described in more detail.

Examples of the photo-crosslinkable polymers which have a photo-dimerizable unsaturated bond and are usable in the present invention are light-sensitive polymers having, in the main chain or at a side chain, a functional group selected from the group consisting of a maleimido group, cinnamyl group, cinnamoyl group, cinnamylidene group, cinnamylidene acetyl group, calcon group or the like.

In particular, the polymers having a maleimido group at a side chain and a polyester resin having a cinnamic acid skeleton in the molecular chain show relatively high sensitivity.

Specific examples of these photo-dimerizable polymers having a maleimido group at a side chain are those having a maleimido group at aside chain represented by the following general formula (II):

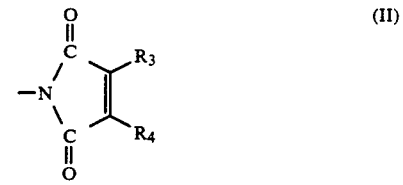

(wherein $R_3$ and $R_4$ each independently represents an alkyl group having at most 4 carbon atoms or $R_3$ and $R_4$ may form a 5- or 6-membered carbon ring together with the carbon atoms to which they are bonded) as disclosed in Japanese Unexamined Published Patent Application (hereunder referred to as "J. P. KOKAI") No. Sho 52-988 (corresponding to U.S. Pat. No. 4,079,041), German Patent No. 2,626,769, European Patent Nos. 21,019 and 3,552 and Die Angewandte Makromolekulare Chemie, 1983, 115, pp. 163–181; and those having a maleimido group at a side chain represented by the following general formula (III):

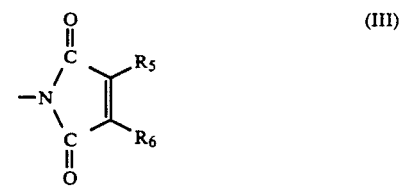

(wherein $R_5$ represents an aromatic group and $R_6$ represents a hydrogen atom, a halogen atom, an alkyl group or a cyano group) as disclosed in J. P. KOKAI Nos. Sho 49-128991, Sho 49-128992, Sho 49-128993, Sho 50-5376, Sho 50-5377, Sho 50-5378, Sho 50-5979, Sho 50-5380, Sho 53-5298, Sho 53-5299, Sho 53-5300, Sho 50-50107, Sho 51-47940, Sho 52-13907, Sho 50-45076, Sho 52-121700, Sho 50-10884 and Sho 50-45087 and German Patent Nos. 2,349,948 and 2,616,276. The average molecular weight of these polymers is in general not less than 1,000 and preferably 10,000 to 100,000.

These polymers have two or more of maleimido groups at side chains per molecule on the average. Among these polymers having maleimido groups at the side chains, those having an acidic group are particularly preferred because the resulting light-sensitive composition can be developed with an alkaline water and hence these polymers do not cause any environmental pollution. The acid value of the maleimido group-containing polymers having an acidic group preferably ranges from 20 to 300 and more preferably 50 to 200. Particularly preferred acidic group-containing polymers are copolymers of N-[2-(methacryloyloxy)ethyl]-2,3-dimethylmaleimide with methacrylic acid or acrylic acid as disclosed in Die Angewandte Makromolekulare Chemie, 1984, 128, pp. 71-91. If a vinyl monomer, as a third component, is present during the copolymerization of the foregoing essential monomers, a multi-component copolymer favorable for a specific purpose can easily be obtained. For instance, flexibility can be imparted to the resulting copolymer if an alkyl (meth)acrylate whose homopolymer has a glass transition point of not more than room temperature is used as the third component, i.e., the vinyl monomer.

Besides, examples of the photo-crosslinkable polymers having a photo-dimerizable unsaturated bond usable in the present invention further include those having at least two groups represented by the following general formula (IV) or (V):

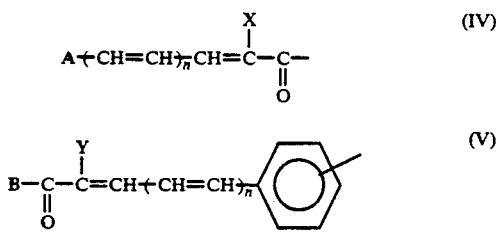

wherein A represents a substituted or unsubstituted aryl group, a furyl group or a thienyl group;

B represents an alkoxy group, a substituted or unsubstituted aryl group or an alkyl group;

X and Y each independently represents a hydrogen atom, a cyano group, a halogen atom, a phenyl group or an alkyl group; and n represents an integer of 0 or 1.

Specific examples of polymers which have, at side chains, at least two groups represented by the general fromula (IV) or (V) are homopolymers of a (meth)acrylate or vinyl ether having a group represented by the general fromula (IV) or (V), copolymers of at least two of the foregoing monomers and multi-component copolymers of these monomers with optional other addition polymerizable vinyl monomers. Examples of the (meth) acrylate or vinyl ether having a group represented by the general fromula (IV) or (V) are those disclosed in U.K. Patent No. 949,919, Japanese Patent Publication for Opposition Purpose (hereinafter referred to as "J.P. KOKOKU") Nos. Sho 45-36755, Sho 46-4603, Sho 49-14352, Sho 49-28122, Sho 50-11283, Sho 50-24621, Sho 51-481, Sho 55-44930, Sho 56-37244, Sho 56-52923 and Sho 57-28488 and J.P. KOKAI Nos. Sho 47-34794, Sho 49-36794 and Sho 49-103975. Among these, preferred are, for instance, polyacrylates, polymethacrylates and polyvinyl ether compounds having a cinnamic acid ester group at a side chain. Preferred molecular weight of these light-sensitive polymeric compounds ranges from 2,000 to 1,000,000 and more preferably 10,000 to 200,000.

In addition, photo-crosslinkable polymers having a photo-dimerizable unsaturated bond in the main chain can also be used in the present invention. Examples thereof are light-sensitive polyesters obtained by condensing phenylene diacrylic acid or an acryl ester thereof with glycol. The polyesters show high light-sensitivity.

Many attempts have been made for solubilizing these polymers in an alkaline aqueous solution. For instance, J.P. KOKAI No. Sho 60-191244 discloses alkaline water developable light-sensitive compositions mainly comprising light-sensitive polymeric compound in which a carboxyl group is introduced into a side chain. Moreover, U.S. Pat. No. 2,861,058 discloses a method for preparing a light-sensitive compound also having alkaline water solubility by reacting a hydroxyl group of a polyvinyl alcohol with cinnamic acid chloride and an acid anhydride; U.S. Pat. No. 2,835,656 discloses a method in which a copolymer of maleic anhydride and styrene is reacted with β-hydroxyethyl cinnamate; U.S. Pat. No. 3,357,831 discloses a method for introducing a cinnamoyl group into a copolymer of 2-hydroxyalkyl methacrylate and methacrylic acid by reacting the copolymer with cinnamoyl chloride; U.S. Pat. No. 3,702,765 discloses a method which comprises the steps of esterifying a phenoxy resin with p-phenylene diacrylic acid monoethyl ester and then hydrolyzing the esterified product; and J.P. KOKAI No. Sho 63-218945 discloses a variety of methods for adding an active mercaptocarboxylic acid to a part of unsaturated double bonds and so forth.

The amount of these light-sensitive polymers to be incorporated into the composition in general ranges from about 20 to 99% by weight and preferably 50 to 99% by weight on the basis of the total weight of the resulting light-sensitive layer.

Then, the sensitizers represented by the general formula (I) which are used in the composition of the present invention will now be explained in more detail below.

In the sensitizers represented by the following general formula (I) which can effectively be used in the present invention:

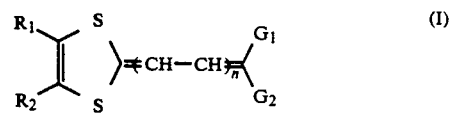

the alkyl groups represented by $R_1$ and $R_2$ are, for instance, those having 1 to 10 carbon atoms such as methyl, ethyl and t-butyl groups and the substituted alkyl groups are, for instance, the foregoing alkyl groups having 1 to 10 carbon atoms which are substituted with hydroxyl, cyano, alkoxy (such as methoxy and ethoxy groups), halogen atoms (such as chlorine and bromine atoms), carboxyl and/or sulfonyl groups.

The aryl groups represented by $R_1$ and $R_2$ are preferably, for instance, phenyl and naphthyl groups and the substituted aryl groups are, for instance, phenyl and naphthyl groups which are substituted with alkyl groups having 1 to 10 carbon atoms, hydroxyl, cyano, alkoxy (such as methoxy and ethoxy groups), halogen atoms (such as chlorine and bromine atoms), carboxyl and/or sulfonyl groups.

The heterocyclic groups represented by $R_1$ and $R_2$ are preferably, for instance, thienyl, benzothienyl, furyl and benzofuryl groups and the substituted heterocyclic groups include, for instance, the foregoing heterocyclic groups which are substituted with halogen atoms (such as chlorine and bromine atoms) and alkyl groups (such as methyl and ethyl groups).

Examples of the substituents of the substituted allyl group represented by $R_1$ and $R_2$ are halogen atoms such as chlorine and bromine atoms and alkyl groups such as methyl and ethyl groups.

Specific examples of the rings formed by $R_1$ and $R_2$ together with the carbon atoms to which they are bonded are aromatic rings such as substituted or unsubstituted benzene, naphthalene and anthracene rings and heterocyclic rings such as substituted and unsubstituted furan, thiophene, imidazole, pyrrole, oxazole, pyrazole, pyrazoline, triazole, tetrazole, furazane, thiazole, pyran, pyridine, pyrazine, triazine, tetrazine, oxazine, benzofuran, benzothiophene, indole, indoline, benzimidazole, benzoxazole, benzothiazole, carbazole and dibenzofuran.

As the rings which are formed by $G_1$ and $G_2$ and comprised of a non-metallic atom and the carbon atoms to which they are bonded, there may be mentioned, for instance, those usually used in merocyanine dyes as acidic nuclei such as those listed below:

(a) 1,3-dicarbonyl nuclei, for instance, 1,3-indandione, 1,3-cyclohexanedione, 5,5-dimethyl-1,3-cyclohexanedione and 1,3-dioxane-4,6-dione;

(b) pyrazolinone nuclei such as 3-methyl-1-phenyl-2-pyrazolin-5-one, 1-phenyl-2-pyrazolin-5-one and 1-(2-benzothiazolyl)-3-methyl-2-pyrazolin-5-one;

(c) isoxazolinone nuclei such as 3-phenyl-2-isoxazolin-5-one and 3-methyl-2-isoxazolin-5-one;

(d) oxyindole nuclei such as 1-alkyl-2,3-dihydro-2-oxyindole;

(e) 2,4,6-triketohexahydropyrimidine nuclei such as barbituric acid or 2-thiobarbituric acid and derivatives thereof, examples of the derivatives being 1-alkyl derivatives such as 1-methyl and 1-ethyl derivatives; 1,3-dialkyl derivatives such as 1,3-diethyl and 1,3-dibutyl derivatives; 1,3-diaryl derivatives such as 1,3-diphenyl, 1,3-di-(p-chlorophenyl) and 1,3-di-(p-ethoxycarbonylphenyl) derivatives; and 1-alkyl-3-aryl derivatives such as 1-ethyl-3-phenyl derivatives;

(f) 2-thio-2,4-thiazolidinedione nuclei such as rhodanine and derivatives thereof, examples of the derivatives being 3-alkylrhodanines such as 3-ethylrhodanine and 3-allylrhodanine, and 3-arylrhodanines such as 3-phenylrhodanine;

(g) 2-thio-2,4-oxazolidinedione (2-thio-2,4-(3H, 5H)oxazoledione) nuclei such as 2-ethyl-2-thio-2,4-oxazolidinedione;

(h) thianaphthenone nuclei such as 3(2H)-thianaphthenone and 3(2H)-thianaphthenone-1,1-dioxide;

(i) 2-thio-2,5-thiazolidinedione nuclei such as 3-ethyl-2-thio-2,5-thiazolidinedione;

(j) 2,4-thiazolidinedione nuclei such as 2,4-thiazolidinedione, 3-ethyl-2,4-thiazolidinedione and 3-phenyl-2,4-thiazolidinedione;

(k) thiazolidinone nuclei such as 4-thiazolidinone and 3-ethyl-4-thiazolidinone;

(l) 4-thiazolinone nuclei such as 2-ethylmercapto-5-thiazolin-4-one and 2-alkylphenylamino-5-thiazolin-4-one;

(m) 2-imino-2-oxozolin-4-one (pseudo hydantoin) nuclei;

(n) 2,4-imidazolidinedione (hydantoin) nuclei such as 2,4-imidazolidinedione; and 3-ethyl-2,4-imidazolidinedione;

(o) 2-thio-2,4-imidazolidinedione (2-thiohydantoin) nuclei such as 2-thio-2,4-imidazolidinedione and 3-ethyl-2-thio-2,4-imidazolidine-dione;

(p) 2-imidazolin-5-one nuclei such as 2-n-propylmercapto-2-imidazolin-5-one; and (q) furan-5-one nuclei.

The amount of the sensitizers used in the composition of the invention preferably ranges from 1 to 30% by weight and more preferably 2 to 20% by weight on the basis of the total weight of the composition.

Specific examples of the sensitizers which are represented by the general formula (I) and used in this invention are as follows:

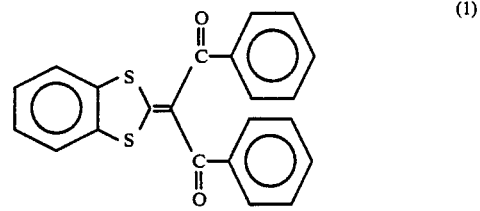

(1)

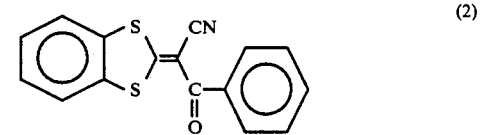

(2)

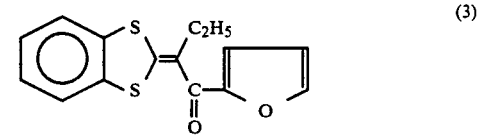

(3)

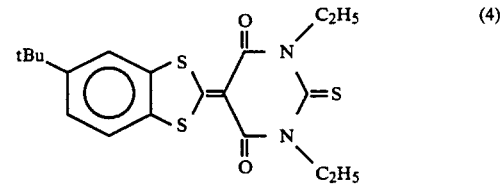

(4)

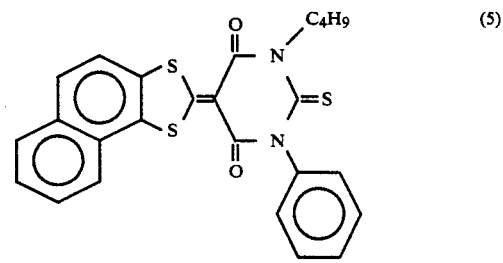

(5)

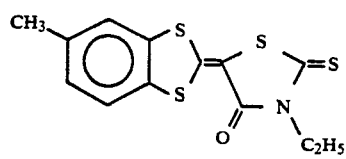 (6)
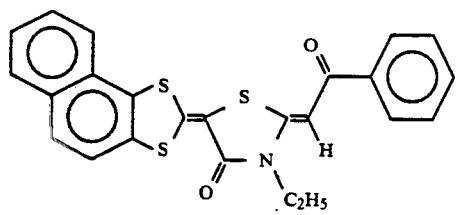 (7)
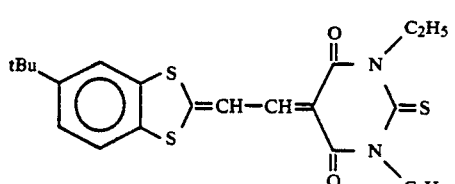 (8)
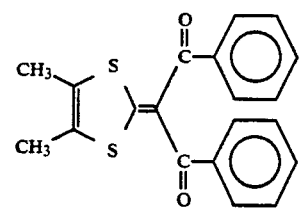 (9)
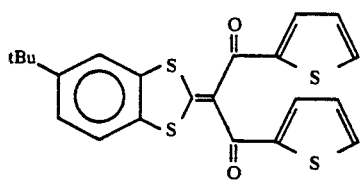 (10)
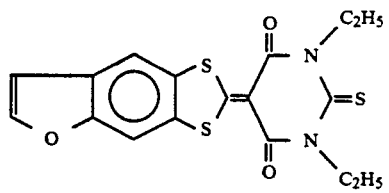 (11)
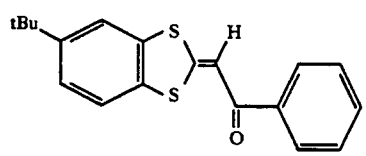 (12)
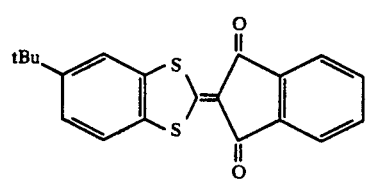 (13)
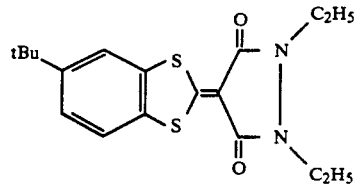 (14)
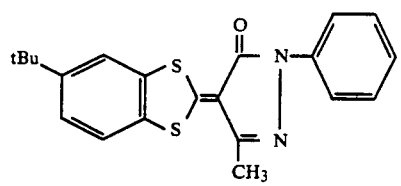 (15)
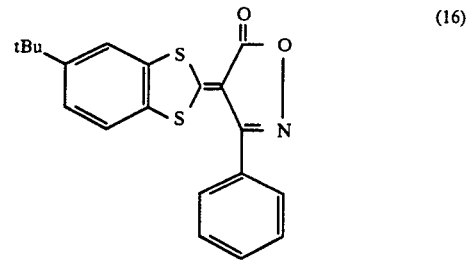 (16)
(17)
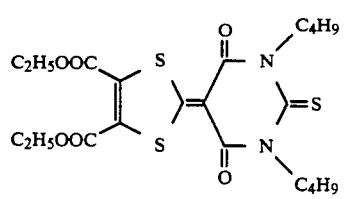 (18)
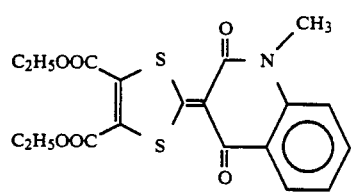 (19)
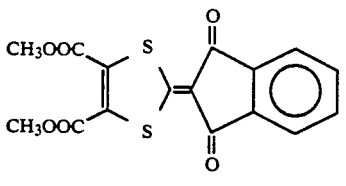 (20)
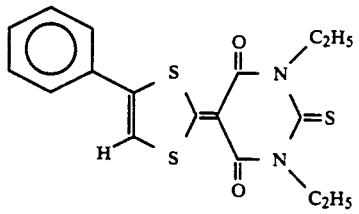 (21)

-continued

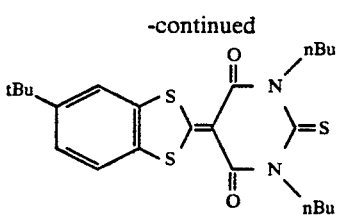

(22)

In the structural formulae of the specific examples listed above, tBu means a tert-butyl group and Ph represents a phenyl group.

The sensitizers used in the present composition can be prepared, for instance, according to the method as detailed below.

A general synthetic method can be expressed by the following reaction scheme:

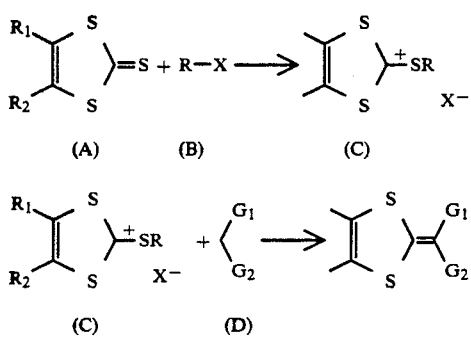

More specifically, 1,3-dithiol-2-thion compound (A) is subjected to S-alkylation (C) with a strong alkylating agent (B) such as alkyl trifluoromethanesulfonate or trialkyloxonium fluoroborate (step 1) and then the alkylated product is reacted with an active methylene compound (D) such as thiobarbituric acid or dibenzoylmethane to eliminate an alkylthio group (step 2). Thus, the sensitizers can be obtained.

Alternatively, the compounds represented by the general formula (I) may be prepared according to the method disclosed in "The Cyanine Dyes and Related Compounds," F.M. Hamer et al., 1964, pp. 511–611. More specifically, these compounds can be obtained by reacting a compound represented by the following general formula (E) with the compound represented by the foregoing formula (D) in the presence of a catalyst such as triethylamine in a proper solvent such as acetonitrile:

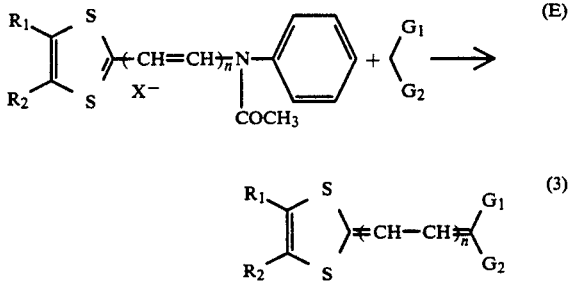

(wherein $X^-$ represents an anion such as $ClO_4^-$, n is an integer of 1 or 2 and $R_1$, $R_2$, $G_1$ and $G_2$ are the same as those defined above in connection with the general formula (I)).

The photo-crosslinkable light-sensitive composition of the present invention may comprise sensitizers other than those represented by the general formula (I). In this case, such other sensitizers are selected so that the photo-crosslinking velocity of the resulting composition is further increased when they are used in combination with the sensitizers of Formula (I). As such sensitizers, there may be mentioned, for instance, benzophenone derivatives, benzanthrone derivatives, quinones, anthraquinones, aromatic nitro compounds, naphthothiazoline derivatives, benzothiazoline derivatives, xanthones, naphthothiazole derivatives, ketocoumalin derivatives, benzothiazole derivatives, naphthofuranone compounds, benzoin compounds, acetophenone compounds, fluorenone compounds, pyrylium salts and thiapyrylium salts.

Specific examples of the other sensitizers are Michler's ketone, N,N'-diethylaminobenzophenone, benzanthrone, (3-methyl-1,3-diaza-1,9-benz)anthrone picramide, 5-nitroacenaphthene, 2-nitrofluorene, 2-dibenzoylmethylene-3-methylnaphthothiazoline, 3, 3-carbonyl-bis(7-diethylaminocoumalin), 2,4,6-triphenylthiapyry lium perchlorate, 2-(p-chlorobenzoyl)naphthothiazole, benzoin, benzoin methyl ether, benzoin ethyl ether, 2,2-dimethoxy-2-phenylacetophenone, 9-fluorenone, 2-chloro-9-fluorenone, 2-methyl-9-fluorenone, 9,10-anthraquinone, 2-ethyl-9,10-anthraquinone, 2-t-butyl-9,10-anthraquinone, 2,6-dichloro-9,10-anthraquinone, xanthone, 2-methyl xanthone, 2-methoxy xanthone, dibenzalacetone, p-(dimethylamino)phenyl styryl ketone and p-(dimethylamino)phenyl-p-methyl styryl ketone.

Moreover, it is desirable to use thioxanthone derivatives such as 2-chlorothioxanthone, 2-isopropyl thioxanthone and dimethyl thioxanthone; and substituted thioxanthones such as those disclosed in German Patent Nos. 3,018,891 and 3,117,568, European Patent No. 33,720 and U.K. Patent No. 2,075,506. The amount of the sensitizers which are used simultaneously with those represented by the general formula (I) preferably ranges from 0.5 to 20% by weight and more preferably 3 to 10% by weight on the basis of the total weight of the composition.

The light-sensitive composition of the present invention may optionally comprise a binder. The binders are usually selected from linear organic polymers. Specific examples of the binders are chlorinated polyethylene, chlorinated polypropylene, poly(alkyl acrylates), copolymers of alkyl acrylates with at least one monomer selected from the group consisting of acrylonitrile, vinyl chloride, styrene and butadiene, polyamides, methyl cellulose, polyvinyl formal, polyvinyl butyral, methacrylic acid copolymers, acrylic acid copolymers, itaconic acid copolymers and diazo resins. These binders can be used alone or in combination. The amount of these binders is in general not more than 50% by weight and preferably not more than 30% by weight on the basis of the total weight of the light-sensitive composition.

The light-sensitive composition of the present invention may preferably comprise stabilizers for preventing crosslinking and hardening due to heat in addition to the foregoing components. Examples of such stabilizers are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidaz ole. These stabilizers may be incorporated into the light-sensitive composition of the present invention in an amount of not more than 5% by weight based on the weight of the composition.

The light-sensitive composition may optionally comprise dyes or pigments for the purpose of coloring the resulting light-sensitive layer. Examples of such dyes or pigments are Methylene Blue, Crystal Violet, Rhodamine B, Fuchsine, Auramine, azo type dyes, anthraquinone type dyes, titanium oxide, carbon black, iron oxide, Phthalocyanine type pigments and azo type pigments. These coloring agents may be added to the light-sensitive composition of the present invention in an amount preferably ranging from 1 to 10% by weight, in particular 2 to 5% by weight on the basis of the total weight of the light-sensitive composition.

The light-sensitive composition of the present invention is dissolved in a proper solvent and then applied onto the surface of a proper substrate in a known manner.

Examples of the solvents used in the application of the light-sensitive composition of the present invention include ethylene dichloride, cyclohexanone, methyl ethyl ketone, methyl cellosolve, ethyl cellosolve, methyl cellosolve acetate, monochlorobenzene, toluene, xylene, propylene glycol monoethyl ether, 1-methoxy-2-propanol, 1-methoxy-2-propyl acetate, 3-methoxypropanol, 3-methoxypropyl acetate, ethyl acetate and butyl acetate. These solvents are used alone or a mixture thereof.

The light-sensitive composition of the present invention is suitable for use in making light-sensitive layers of PS plates. The light-sensitive composition is applied onto a proper substrate to thus obtain such PS plates. Examples of the substrates which are suitably used in the production of such PS plates include hydrophilized aluminum plates such as silicate treated aluminum plates, anodized aluminum plates and silicate-electrodeposited aluminum plates as well as zinc plates, stainless steel plates, chromium-treated copper plates and hydrophilized plastic films or paper.

When a PS plate is prepared using the light-sensitive composition of the present invention, an aluminum plate is preferably used as a substrate. The surface of the aluminum plate is preferably subjected to a surface-treatment such as graining, a dipping treatment, for instance, dipping in an aqueous solution of sodium silicate, potassium fluorozirconate or a phosphate or an anodizing treatment.

Moreover, an aluminum plate which is grained and then dipped in an aqueous solution of sodium silicate as disclosed in U.K. Patent No. 851,819 can be suitably used in the present invention. An aluminum plate which is anodized and then dipped in an aqueous solution of an alkali metal silicate as disclosed in J.P. KOKOKU No. Sho. 47-5125 is also preferably used in the present invention. In this case, the anodization is performed by passing an electric current through the aluminum plate serving as an anode in an electrolyte such as an aqueous solution or a non-aqueous solution of an inorganic acid, for instance, phosphoric acid, chromic acid, sulfuric acid or boric acid, or an organic acid such as oxalic acid or sulfamic acid or a mixture thereof.

In addition, silicate electrodeposition as disclosed in U.S. Pat. No. 3,658,662 is also effective as the surface treatment of the aluminum plate.

It is also effective to use a surface treatment comprising the combination of an electrolytic graining in which hydrochloric acid or nitric acid is used as an electrolytic bath, the aforementioned anodization and a silicate treatment as disclosed in J.P. KOKOKU No. Sho 46-27481 and J.P. KOKAI Nos. Sho 52-58602 and Sho 52-30503.

Further, the aluminum plate may suitably subjected to, in order, a mechanical graining, a chemical etching treatment, electrolytic graining, an anodization treatment and a silicate treatment as disclosed in J.P. KOKAI No. Sho 56-28893.

Besides, it is preferable to employ an aluminum plates obtained by subjecting to the foregoing treatment and then applying an underlying coating of a water-soluble resin such as poly(vinyl-phosphonic acid), polymers or copolymers having sulfonic acid residues at a side chain or polyacrylic acid; a water-soluble metal salt such as zinc borate; or a yellow dye or an amine salt.

These hydrophilization treatments are performed not only for making the surface of the substrate hydrophilic, but also for preventing the occurrence of detrimental reactions of the surface with the light-sensitive composition applied thereto and for enhancing the adhesion between the light-sensitive layer and the surface as well as other purposes.

When a PS plate is prepared, the amount of the light-sensitive composition to be applied to the surface of a substrate in general ranges from 0.1 to 10.0 $g/m^2$ and preferably 0.5 to 5.0 $g/m^2$ expressed in the solid contents.

When the light-sensitive composition is used as a photoresist, a variety of substrates made of copper plates, copper-plated plates, stainless steel plates, glass plates or the like can be used.

As developers for the development of the light-sensitive layers obtained from the light-sensitive composition of the present invention, preferred are, for instance, aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia; alkaline aqueous solution containing a small amount of an organic solvent such as benzyl alcohol, 2-phenoxyethanol, 2-butoxyethanol or n-propyl alcohol. In addition, other excellent developer for developing the PS plate obtained from the light-sensitive composition of the present invention further include those disclosed in U.S. Pat. Nos. 3,475,171 and 3,615,480, J.P. KOKAI No. Sho 50-26601 and J.P. KOKOKU Nos. Sho 56-39464 and Sho 56-42860.

The present invention will hereunder be explained in more detail with reference to the following non-limitative working Examples and Preparation Examples and the effects practically achieved by the invention will also discussed in detail in comparison with Comparative Examples. In the following description, "%" means "% by weight" unless otherwise specified.

PREPARATION EXAMPLE

Preparation of 2-(5-t-butyl-1,3-benzodithiol-2-ylidene)-1,3-diethylthiobarbituric acid:

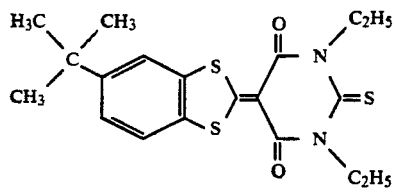

To a solution of 2.0 g of 5-t-butyl-1,3-benzodithiol-2-thion in 100 ml of methylene chloride, there was dropwise added 0.9 g of ethyl trifluoromethanesulfonate at room temperature. After allowing to stand over night, 1.0 g of 1,3-diethylthiobarbituric acid was added to the solution and then 3 ml of triethylamine was dropwise added thereto. After allowing to stand over night, the solvent was removed under reduced pressure. The resulting residue was recrystallized from ethanol. Yield: 0.63 g; yellow needles; m.p. 185°–186° C.

Visible absorption spectrum (in THF): absorptivity coefficient at 409 nm = $8.63 \times 10^4$.

| Elemental Analysis | C (%) | H (%) | N (%) |
|---|---|---|---|
| Calculated | 56.11 | 5.45 | 6.89 |
| Found | 56.08 | 5.44 | 7.03 |

EXAMPLES 1 TO 4 AND COMPARATIVE EXAMPLES 1 TO 3

The surface of an aluminum plate having a thickness of 0.30 mm was grained with a nylon brush and an aqueous suspension of 400 mesh pumice stone and then washed with water sufficiently. The aluminum plate was etched by immersing it in a 10% aqueous solution of sodium hydroxide at 70° C. for 60 seconds, washed with running water, neutralized and washed with a 20% $HNO_3$ solution and then washed with water. The plate was then electrolytically grained in a 1% nitric acid using alternating sinusoidal current under the condition of $V_a=12.7$ V such that the quantity of electricity at anode time was 160 coulomb/$dm^2$. At this stage, the surface roughness thereof was determined to be 0.6 $\mu$ (expressed in Ra unit). Subsequently, the aluminum plate was immersed in a 30% $H_2SO_4$ aqueous solution to perform desmutting at 55° C. for 2 minutes. Then, the plate was anodized at a current density of 2 A/$dm^2$ in a 20% $H_3PO_4$ aqueous solution so that the amount of the anodized layer formed was equal to 1.2 g/$m^2$ (pore diameter of the anodized film = 1,000 Å). The plate was then immersed in a 2.5% aqueous solution of sodium silicate maintained at 70° C. for one minute, washed with water and then dried.

Then, a PS plate was prepared by applying, to the surface of the aluminum plate thus prepared, a light-sensitive solution I which contained a sensitizer listed in the following Table I and had the following composition, with a whirler at a rate of revolution of 200 r.p.m. and then dried at 100° C. for 2 minutes. The thickness of the coated light-sensitive layer was about 1.5 $\mu$ (on dry basis).

LIGHT-SENSITIVE SOLUTION I:

| Component | Amount (g) |
|---|---|
| 20% Solution of methyl methacrylate/N-(2-(methacryloyloxy)ethyl)-2,3-dimethylmaleimide/methacrylic acid (molar ratio = 15/65/20) in a methyl ethyl ketone/2-methoxy-ethanol (1:1) mixture (The resin V disclosed in J. P. KOKAI No. Sho 59-206425) | 25 |
| Sensitizer (see Table I given below; exemplified compound) | 0.5 |
| F-177 (fluorine atom-containing nonionic surfactant: availabl from DAINIPPON INK AND CHEMICALS, INC.) | 0.02 |
| 10% Dispersion of Cu-Phthalocyanine pigment (CI pigment Blue 15) in a plasticizer | 1.0 |
| Methyl ethyl ketone | 20 |
| Methanol | 2 |
| Ethylene glycol monomethyl ether acetate | 28 |

A step wedge having a density difference of 0.15 and a step number of 15 was put on the resulting PS plate and the plate was exposed to light from a 2 KW super high pressure mercury lamp for 16 seconds with a vacuum printing frame. After the exposure, the plate was developed with a developer having the following formulation:

| Developer: Component | Amount (g) |
|---|---|
| Benzyl alcohol | 4.5 |
| 38% Aqueous solution of sodium isopropyl-naphthalene sulfonate | 4.5 |
| Triethanolamine | 1.5 |
| Monoethanolamine | 0.1 |
| Sodium sulfite | 0.3 |
| Pure water | 100 |

The highest step number of the step wedge corresponding to the developed images was determined and it was listed in Table I as the sensitivity of each corresponding sample. The higher the step number, the higher the sensitivity of the sample.

By way of comparison, there were prepared PS plates from light-sensitive solutions in which 2,3-dimethylthioxanthone (Comparative Example 1) or Michler's ketone (Comparative Example 2) was substituted for the compound of the present invention as the sensitizer and a light-sensitive solution which did not contain a sensitizer (Comparative Example 3). The sensitivity of these PS plates are also listed in Table I.

TABLE I

| | Sensitizer Used | Maximun Number of Step wedge |
|---|---|---|
| Example 1 | Exemplified Compound (1) | 9 |
| 2 | Exemplified Compound (4) | 11 |
| 3 | Exemplified Compound (5) | 10 |
| 4 | Exemplified Compound (8) | 10 |
| Comp. Ex. 1 | 2,3-dimethylthioxanthone | 8 |
| 2 | Michler's ketone | 2 |
| 3 | none | 0 |

EXAMPLES 5 to 7

An aluminum plate was subjected to a surface treatment in the same manner as used in Examples 1 to 4 to obtain an aluminum substrate.

Then PS plates were prepared by applying a light-sensitive solution II which contained a sensitizer listed in Table II and had the following composition onto the surface of the aluminum substrate as in Examples 1 to 4 and then drying the coated layer.

LIGHT-SENSITIVE SOLUTION II

| Component | Amount (g) |
|---|---|
| β-cinnamoyloxyethyl methacrylate/methacrylic acid (molar ratio = 70/30) | 5.0 |
| Sensitizer (see Table II given below; exemplified compound) | 0.5 |
| F-177 (fluorine atom-containing nonionic surfactant: availabl from DAINIPPON INK AND CHEMICALS, INC.) | 0.02 |
| 10% Dispersion of Cu-Phthalocyanine pigment (CI pigment Blu 15) in a plasticizer | 1.0 |
| Methyl ethyl ketone | 20.0 |
| Methanol | 2.0 |
| Ethylene glycol monomethyl ether acetate | 28 |

The PS plates thus obtained were exposed to light and developed in the same manner as used in Examples 1 to 4. The results thus obtained are summarized in Table II. By way of comparison, there were prepared PS plates from a light-sensitive solution in which 5-nitroacenaphthene was substituted for the compound of the present invention as the sensitizer (Comparative Example 4) and a light-sensitive solution which did not contain a sensitizer (Comparative Example 5). The sensitivity of these PS plates are also listed in Table II.

TABLE II

| Sensitizer Used | Maximum Number of Step wedge |
|---|---|
| Example 5 Exemplified Compound (4) | 9 |
| 6 Exemplified Compound (10) | 8 |
| 7 Exemplified Compound (12) | 7 |
| Comp. Ex. 4 5-nitroacenaphthene | 5 |
| 5 none | 0 |

EXAMPLES 8 AND 9 AND COMPARATIVE EXAMPLE 6

The same procedures used in Examples 1 to 4 were repeated to form PS plates except that a light-sensitive solution III having the following composition was used.

LIGHT-SENSITIVE SOLUTION III

| Component | Amount (g) |
|---|---|
| Polymer obtained by condensation of p-phenylenediethoxy acrylayte with 1,4-di-β-hydroxyethoxycyclohexane represented by the following structural formula: | 5.0 |

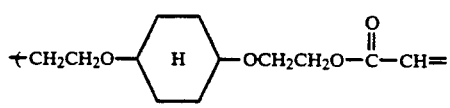

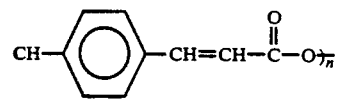

| Component | Amount (g) |
|---|---|
| Sensitizer (see Table III given below; exemplified compound) | 0.3 |
| PF₆ salt of a condensate of p-diazodiphenylamine with formaldehyde | 0.1 |
| 10% Dispersion of Cu-Phthalocyanine pigment (CI pigment Blue 15) in a plasticizer | 1.0 |
| Diethyl phthalate | 0.5 |
| Methyl ethyl ketone | 20 |
| Propylene glycol monomethyl ether | 30 |

The PS plates thus obtained were exposed to light and developed in the same manner as used in Examples 1 to 4. The results thus obtained are summarized in Table III. By way of comparison, there was prepared a PS plate from a light-sensitive solution in which 2-benzoylmethylene-3-methylnaphthothiazole was substituted for the compound of the present invention as the sensitizer (Comparative Example 6). The sensitivity of these PS plates are also listed in Table III.

TABLE III

| Sensitizer Used | Maximum Number of Step wedge |
|---|---|
| Example 8 Exemplified Compound (4) | 9 |
| 9 Exemplified Compound (11) | 8 |
| Comp. Ex. 6 2-benzoylmethylene-3-methyl-naphthothizole | 7 |

As seen from the results listed in the foregoing Tables, if the sensitizer of the present invention is incorporated in the light-sensitive composition, the sensitivity thereof is considerably improved as compared with that observed on the conventional ones.

What is claimed is:

1. A light-sensitive composition comprising a photo-crosslinkable polymer having a photo-dimerizable unsaturated bond and a sensitizer represented by the following general formula (I):

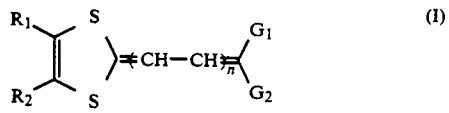

wherein $R_1$ and $R_2$ each independently represents a hydrogen atom, an alkyl group, a carbocyclic aryl group, or a heterocyclic group, provided that $R_1$ and $R_2$ may form a ring together with the carbon atoms to which they are attached;

n represents 0, 1 or 2; and $G_1$ and $G_2$ each independently represents a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluoroalkylsulfonyl group, provided that $G_1$ and $G_2$ do not represent a hydrogen atom simultaneously and that $G_1$ and $G_2$ may combine to form a ring selected from 1,3-dicarbonyl nuclei, pyrazolinone nuclei, isoxazolinone nuclei, oxyindole nuclei, 2,4,6-triketohexahydropyrimidine nuclei, 2-thio-2,4-thiazolidinedione nuclei, 2-thio-2,4-oxazolidinedione nuclei, thianaphthenone nuclei, 2-thio-2,5-thiazolidinedione nuclei, 2,4-thiazolidinedione nuclei, thiazolidinone nuclei, 4-thiazolinone nuclei, 2-imino-2-oxozolin-4-one nuclei, 2,4-imidazolidinedione nuclei, 2-thio-2,4-imidazolidinedione nuclei, 2-imidazolin-5-one nuclei and furan-5-one nuclei.

2. The light-sensitive composition of claim 1 wherein said $R_1$ and $R_2$ each represents an alkyl group having 1 to 10 carbon atoms; a phenyl or naphthyl group; or a thienyl, benzothienyl, furyl or benzofuryl group; or said ring formed by $R_1$ and $R_2$ is selected from the group consisting of benzene, naphthalene, anthracene, furan, thiophene, imidazole, pyrrole, oxazole, pyrazole, pyrazoline, triazole, tetrazole, furazane, thiazole, pyran, pyridine, pyrazine, triazine, tetrazine, oxazine, benzofuran, benzothiophene, indole, indoline, benzimidazole, benzoxazole, benzothiazole, carbazole and dibenzofuran ring.

3. The light-sensitive composition of claim 1 wherein said ring formed from $G_1$ and $G_2$ is selected from the group consisting of 1,3-indandione, 1,3-cyclohexanedione, 5,5-dimethyl-1,3-cyclohexanedione, 1,3-dioxane-4,6-dione, 3-methyl-1-phenyl-2-pyrazolin-5-one, 1-phenyl-2-pyrazolin-5-one, 1-(2-benzothiazolyl)-3-methyl-2-pyrazolin-5-one, 3-phenyl-2-isoxazolin-5-one, 3-methyl-2-isoxazolin-5-one, 1-alkyl-2,3-dihydro-2-oxyindole; barbituric acid, 2-thiobarbituric acid and 1-methyl, 1-ethyl, 1,3-diethyl, 1,3-dibutyl, 1,3-diphenyl, 1,3-di-(p-chlorophenyl), 1,3-di-(p-ethoxycarbonylphenyl) and 1-ethyl-3-phenyl derivatives thereof; rhodanine, 3-ethylrhodanine, 3-allylrhodanine, 3-phenylrhodanine, 2-ethyl-2-thio-2,4-oxazolidinedione, 3(2H)-thianaphthenone, 3(2H)-thianaphthenone-1,1-dioxide, 3-ethyl-2-thio-2,5-thiazolidinedione, 2,4-thiazolidinedione, 3-ethyl-2,4-thiazolidinedione, 3-phenyl-2,4-thiazolidinedione, 4-thiazolidinone, 3-ethyl-4-thiazolidinone, 2-ethylmercapto-5-thiazolin-4-one, 2-alkylphenylamino-5-thiazolin-4-one, 2-imino-2-oxozolin-4-one, 2,4-imidazolidinedio ne, 3-ethyl-2,4-imidazolidinedione, 2-thio-2,4-imidazolidinedion e, 3-ethyl-2-thio-2,4-imidazolidinedione, 2-n-propylmercapto-2-imidazolin-5-one and furan-5-one nuclei.

4. The light-sensitive composition of claim 1 wherein said sensitizer is selected from the group consisting of:

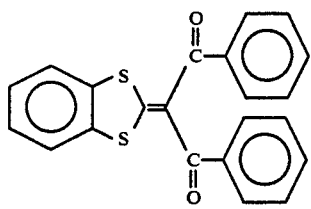

(1)

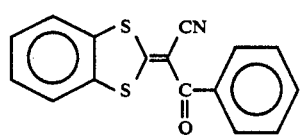

(2)

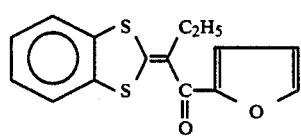

(3)

-continued

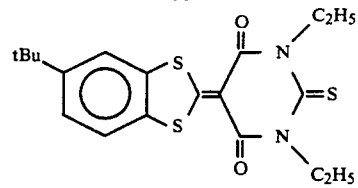

(4)

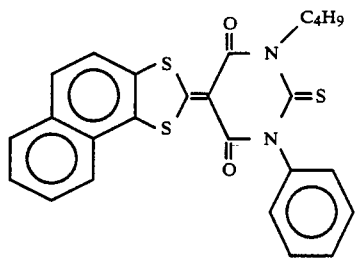

(5)

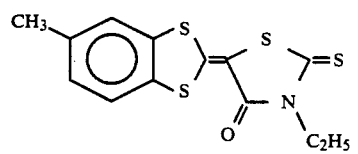

(6)

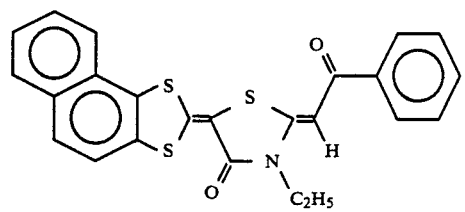

(7)

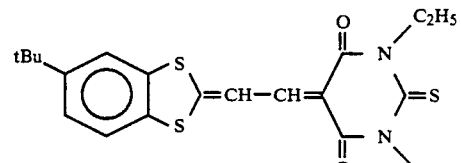

(8)

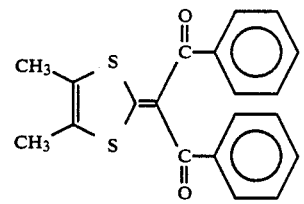

(9)

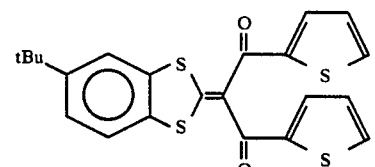

(10)

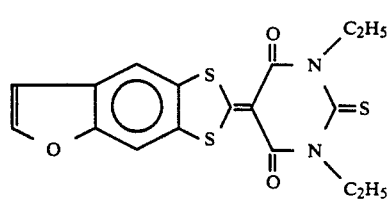

(11)

-continued

(12) 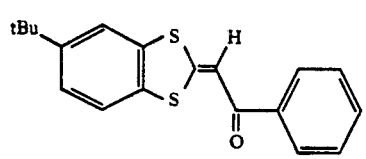

(13) 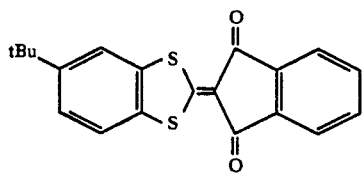

(14) 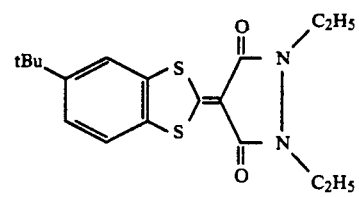

(15) 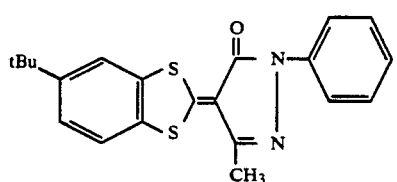

(16) 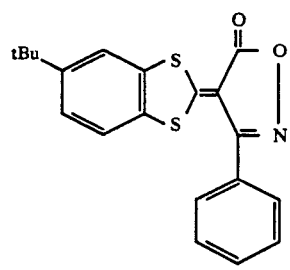

(17) 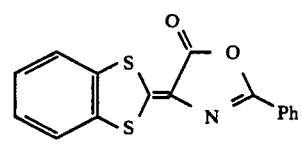

(18) 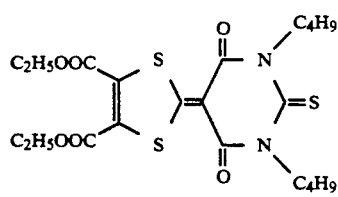

(19) 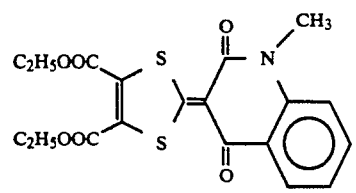

-continued

(20) 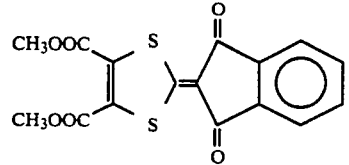

(21) 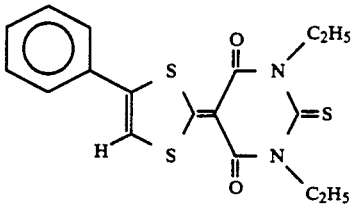

(22) 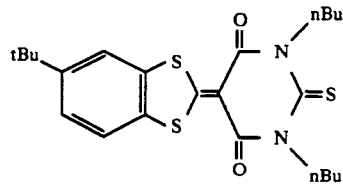

5. The light-sensitive composition of claim 1 wherein the sensitizer is used in the composition in an amount ranging from 1 to 30% by weight on the basis of the total weight of the composition.

6. The light-sensitive composition of claim 5 wherein the sensitizer is used in the composition in an amount ranging from 2 to 20% by weight on the basis of the total weight of the composition.

7. The light-sensitive composition of claim 1 wherein said photo-crosslinkable polymer has, in the main chain or at a side chain, a functional group selected from the group consisting of a maleimido group, cinnamyl group, cinnamoyl group, cinnamylidene group, and cinnamylidene acetyl group.

8. The light-sensitive composition of claim 7 wherein said photo-crosslinkable polymer has a maleimido group at a side chain or is a polyester resin having a cinnamic acid skeleton in the main chain.

9. The light-sensitive composition of claim 8 wherein said photo-crosslinkable polymer is selected from the group consisting of polymers having a maleimido group at a side chain represented by the following general formula (II):

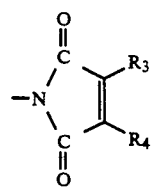

(II)

(wherein $R_3$ and $R_4$ each independently represents an alkyl group having at most 4 carbon atoms or $R_3$ and $R_4$ may form a 5- or 6-membered carbon ring together with the carbon atoms to which they are bonded) and those having a maleimido group at a side chain represented by the following general formula (III):

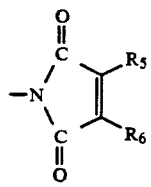
(III)

(wherein $R_5$ represents an aromatic group and $R_6$ represents a hydrogen atom, a halogen atom, an alkyl group or a cyano group).

10. The light-sensitive composition of claim 9 wherein said photo-crosslinkable polymer has at least two maleimido groups at side chains per molecule on the average.

11. The light-sensitive composition of claim 10 wherein said photo-crosslinkable polymer further has an acidic group.

12. The light-sensitive composition of claim 11 wherein said photo-crosslinkable polymer having an acidic group is a copolymer of N—[2-(methacryloyloxy)ethyl]-2,3-dimethylmaleimide with methacrylic acid or acrylic acid.

13. The light-sensitive composition of claim 7 wherein said photo-crosslinkable polymer having a photo-dimerizable unsaturated bond has at least two groups selected from the group consisting of those represented by the following general formula (IV) or (V):

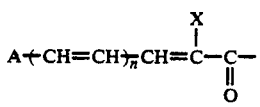
(IV)

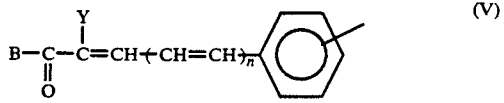
(V)

wherein A represents a substituted or unsubstituted aryl group, a furyl group or a thienyl group; B represents an alkoxy group, a substituted or unsubstituted aryl group or an alkyl group; X and Y each independently represents a hydrogen atom, a cyano group, a halogen atom, a phenyl group or an alkyl group; and n represents an integer of 0 or 1.

14. The light-sensitive composition of claim 13 wherein said photo-crosslinkable polymer is a polyacrylate, polymethacrylate or polyvinyl ether compound having a cinnamic acid ester group at a side chain.

15. The light-sensitive composition of claim 1 wherein the amount of said photo-crosslinkable polymer ranges from about 20 to 99% by weight on the basis of the total weight of the composition.

16. The light-sensitive composition of claim 15 wherein the amount of said photo-crosslinkable polymer ranges from 50 to 99% by weight on the basis of the total weight of the composition.

17. A presensitized plate comprising an aluminum substrate having a light-sensitive layer comprising the light-sensitive composition in claim 1.

18. The presensitized plate of claim 17, wherein the light-sensitive layer has a coverage in the range of from 0.1 to 10 g/m².

19. The presensitized plate of claim 18, wherein the surface of the aluminum substrate has been grained and then anodized.

* * * * *

UNITED STATES PATENT AND TRADEMARK OFFICE
CERTIFICATE OF CORRECTION

PATENT NO. : 5,064,747

DATED : November 12, 1991

INVENTOR(S) : Masanori IMAI, et al.

It is certified that error appears in the above-identified patent and that said Letters Patent is hereby corrected as shown below:

Title page:

Item (21) should read -- 554,469--.

Signed and Sealed this

Second Day of March, 1993

*Attest:*

STEPHEN G. KUNIN

*Attesting Officer*     Acting Commissioner of Patents and Trademarks